(12) United States Patent
Feurle et al.

(10) Patent No.: US 6,310,399 B1
(45) Date of Patent: Oct. 30, 2001

(54) SEMICONDUCTOR MEMORY CONFIGURATION WITH A BIT-LINE TWIST

(75) Inventors: Robert Feurle, Neubiberg; Sabine Mandel, München; Dominique Savignac, Ismaning; Helmut Schneider, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/514,268

(22) Filed: Feb. 28, 2000

(30) Foreign Application Priority Data

Feb. 26, 1999 (DE) .............................................. 199 08 428

(51) Int. Cl.$^7$ .................................................. H01L 23/48
(52) U.S. Cl. ........................................... 257/776; 257/907
(58) Field of Search ...................................... 257/296, 776, 257/906, 907, 908; 365/63, 69, 210

(56) References Cited

U.S. PATENT DOCUMENTS

| | | | | |
|---|---|---|---|---|
| 5,747,844 | * | 5/1998 | Aoki et al. | 257/296 |
| 5,821,592 | * | 10/1998 | Hoenigschmid et al. | 257/390 |
| 5,864,181 | * | 1/1999 | Keeth | 257/776 |
| 6,066,870 | * | 5/2000 | Siek | 257/296 |

* cited by examiner

*Primary Examiner*—Olik Chaudhuri
*Assistant Examiner*—Hoai Pham
(74) *Attorney, Agent, or Firm*—Herbert L. Lerner; Laurence A. Greenberg; Werner H. Stemer

(57) ABSTRACT

A semiconductor memory configuration includes bit lines in a bit-line plane, a further plane different from the bit-line plane, word lines, and a memory cell area adjacent the bit-line plane, some of the bit lines having a twist running alongside others of the bit lines being untwisted, pairs of the some of the bit lines with a twist each respectively defining a twist bit-line pair, the twist bit-line pair having contacts for crossing one bit line of the twist bit-line pair over another bit line of the twist bit-line pair and over the memory-cell area through the further plane, the untwisted others of the bit lines having dummy contacts leading from the bit-line plane to the further plane. The dummy contacts lead to the word-line plane to give the word lines a homogeneous environment. The further plane can be a word-line plane including the word lines. The bit lines in the twist-free area can be approximately from 150 nm to 250 nm wide, preferably 200 nm. The twist area can only include the twist of the bit lines. The bit lines in the twist area can be approximately from 250 nm to 350 nm wide, preferably, 330 nm wide. The bit lines can have spacing from 150 to 180 nm wide. The bit lines, the word lines, the contacts, and the dummy contacts can be made from copper or aluminum.

9 Claims, 2 Drawing Sheets

SEMICONDUCTOR MEMORY CONFIGURATION WITH A BIT-LINE TWIST

BACKGROUND OF THE INVENTION

Field of the Invention

The invention lies in the field of semiconductors. The present invention relates to a semiconductor memory configuration having word lines and bit lines. Some bit lines are routed over a memory-cell area. Bit lines with a twist run alongside bit lines without a twist, and one bit-line pair with a twist has contacts for one bit line to be crossed over by the other bit line of the pair in a further plane that is different from the bit-line plane.

Conventionally, bit lines are routed over memory-cell areas with a bit-line twist and without a bit-line twist. A bit-line twist has the advantage that the two bit lines that cross each other through the twist are symmetrically coupled capacitively such that possible interference signals cancel each other. In addition, coupling in from adjacent lines is also canceled if "folded" bit lines are involved.

The crossing over of two bit lines in a twist assumes that one of the bit lines is routed over the other bit line at a distance and in an electrically insulated manner. The crossover can be done, for example, by raising one bit line (in relation to the other bit line) in the crossover area into the word-line plane through contacts, such that in the crossover area one bit line runs in the word-line plane, while the other bit line remains on the bit-line plane.

Adjacent bit lines should influence each other as little as possible, that is to say the electrical coupling between such adjacent bit lines should be reduced as far as possible. The reduction can be done by routing the bit lines with a large spacing and without a twist or crossover in relation to one another. However, such a large spacing is necessarily associated with a considerably increased area requirement for the memory-cell area.

In order to avoid the large spacing, the above mentioned twist is introduced. Then, the bit lines can run more closely alongside one another, thus, canceling the interference introduced by the capacitive coupling that is necessarily present as a result of the twist. At present, preference is given to semiconductor memory configurations in which bit lines are provided in pairs, without a twist and with a twist. Such preference means that two bit lines without a twist follow two bit lines with a twist. It has been shown that such a configuration of the bit lines achieves optimization with regard to reducing the effects of the capacitive coupling arising from the twist of each second bit-line pair, simplifies the circuit structure arising from the necessary crossovers for each second pair, and reduces the area required.

However, one disadvantage of configuring a semiconductor memory as set forth above is that in the word-line plane the individual word lines experience different proximity effects at different locations because it is only in the area of the bit-line pairs with a twist that the one bit lines, with their contacts, are routed into the word-line plane. Therefore, different and inhomogeneous affects on the word lines occur in the crossover area of the bit lines in an undesired way.

SUMMARY OF THE INVENTION

It is accordingly an object of the invention to provide a semiconductor memory configuration with a bit-line twist that overcomes the hereinafore-mentioned disadvantages of the heretofore-known devices of this general type and that provides the maximum electrical and geometrical symmetry with a minimum area requirement such that the non-uniform influence of edge elements, specifically word lines, in the crossover or twist area of the bit lines is avoided.

With the foregoing and other objects in view, there is provided, in accordance with the invention, a semiconductor memory configuration, including bit lines in a bit-line plane, a further plane different from the bit-line plane, word lines, and a memory cell area adjacent the bit-line plane, some of the bit lines having a twist running alongside others of the bit lines being untwisted, pairs of the some of the bit lines with a twist each respectively defining a twist bit-line pair, the twist bit-line pair having contacts for crossing one bit line of the twist bit-line pair over another bit line of the twist bit-line pair and over the memory-cell area through the further plane, the untwisted others of the bit lines having dummy contacts leading from the bit-line plane to the further plane.

In accordance with another feature of the invention, the further plane is a word-line plane and the word lines are in the word-line plane.

In accordance with a further feature of the invention, the bit-line plane has a twist area including the twist of the some of the bit lines and a twist-free area, and the bit lines in the twist-free area are approximately from 150 nm to 250 nm wide.

In accordance with an added feature of the invention, the twist area only includes the twist of the some of the bit lines.

In accordance with an additional feature of the invention, the bit lines in the twist-free area are approximately 200 nm wide.

In accordance with yet another feature of the invention, the bit-line plane has a twist area including the twist of the some of the bit lines and the some of the bit lines in the twist area are approximately from 250 nm to 350 nm wide.

In accordance with yet a further feature of the invention, some of the bit lines in the twist area are approximately 330 nm wide.

In accordance with yet an added feature of the invention, the bit lines have spacing between each other approximately from 150 to 180 nm wide.

In accordance with a concomitant feature of the invention, the bit lines, the word lines, the contacts, and the dummy contacts are selected from the group consisting of copper and aluminum.

As a result of the dummy contacts, edge elements in the further plane that, in the twist area, adjoin the contacts of the bit lines, have the same electrical "environment," so that different proximity effects are avoided. Therefore, the bit lines can be routed with high area efficiency, extremely homogeneously and, both electrically and geometrically, in a largely symmetrical manner, so that no problems are caused with edge elements in the crossover area.

The memory-cell area located under the bit lines is completely regular in the area of the crossover or of the twist, so that no additional edge areas result in the memory-cell area either, and the introduction of special edge elements is not necessary. As a result of the close routing of the bit lines alongside one another, the area requirement is also desirably and advantageously kept low.

Other features that are considered as characteristic for the invention are set forth in the appended claims.

Although the invention is illustrated and described herein as embodied in a semiconductor memory configuration with a bit-line twist, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
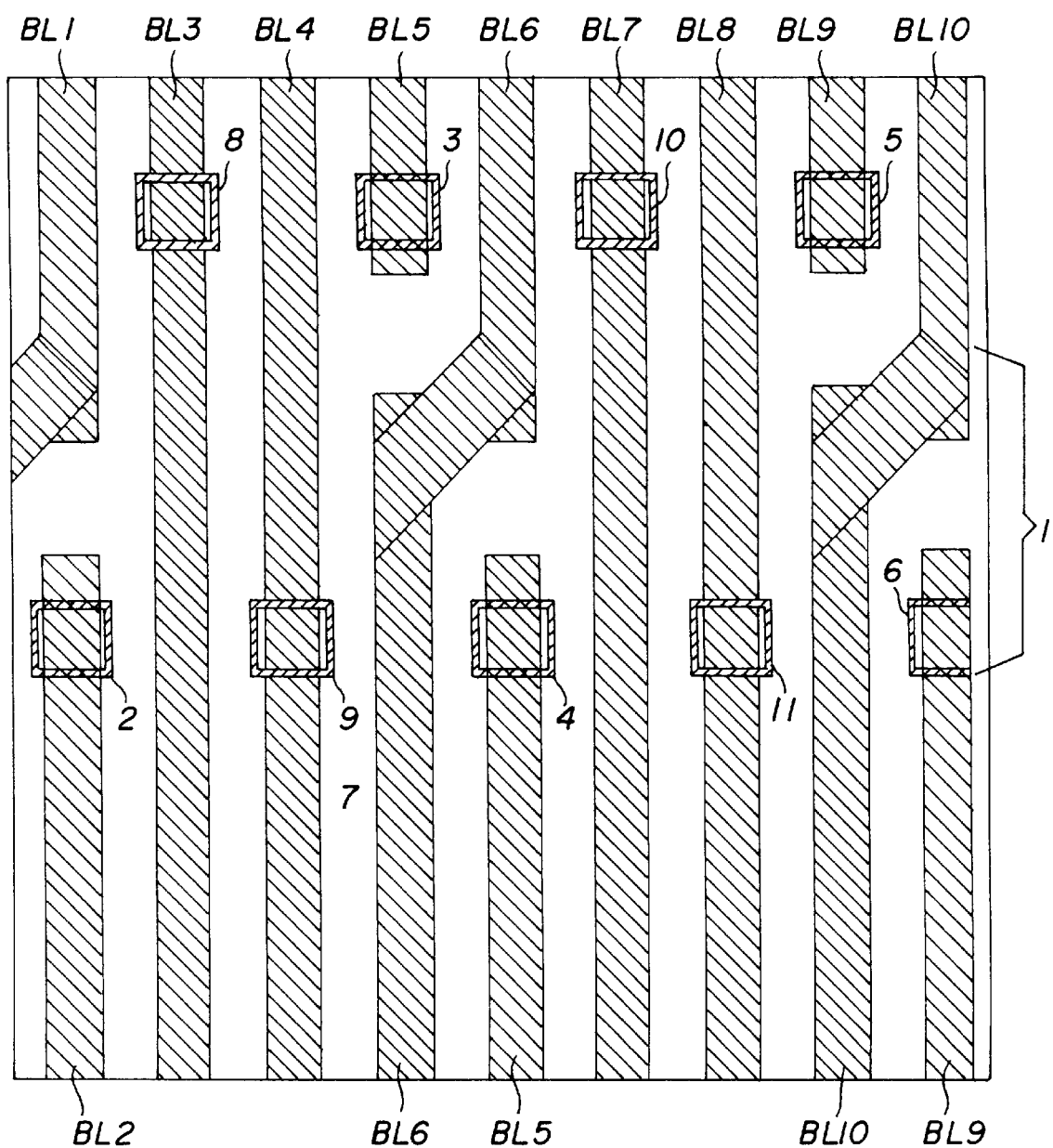
FIG. 1 is a diagrammatic sectional plan view of bit lines with a twist and bit lines without a twist in the bit-line plane according to the invention.

In all the figures of the drawing, sub-features and integral parts that correspond to one another bear the same reference symbol in each case.

Referring now to the figures of the drawings in detail and first, particularly to FIG. 1 thereof, there is shown bit lines BL1 to BL10, of which the bit lines BL1 and BL2, BL5 and BL6 and BL9 and BL10 are bit lines with a twist, while the bit lines BL3 and BL4 and BL7 and BL8 represent twist-free bit lines. In other words, bit line BL2 crosses over bit line BL1, bit line BL5 crosses over bit line BL6, and bit line BL9 crosses over bit line BL10. In each case, the crossovers occur in a higher plane that is different from the bit-line plane illustrated in FIG. 1. Therefore, while bit lines BL1, BL6 and BL10 are routed so as to be offset in a twist or crossover area 1, the bit lines BL2, BL5, and BL9 (whose upper halves are not illustrated in FIG. 1) are raised into a plane located above by contacts 2, 3 and 4, and 5 and 6, respectively, in order to cross over the bit lines BL1, BL6, and BL10, respectively, in the twist area 1 in the higher plane.

Figure 2:
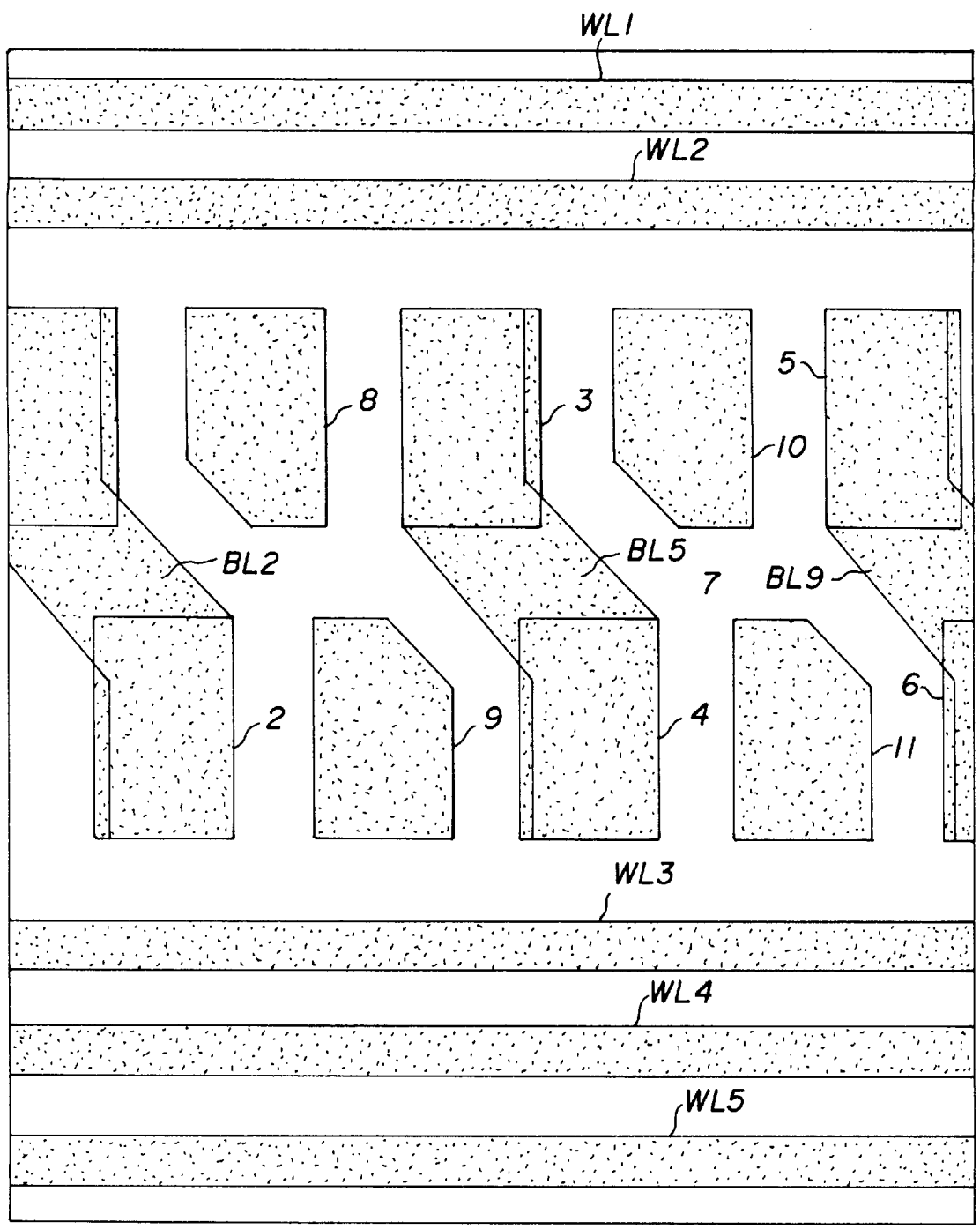
FIG. 2 is an enlarged diagrammatic sectional plan view of a twist area of FIG. 1 in the word-line plane.

The higher plane is illustrated and enlarged in FIG. 2, which shows a word-line plane having word lines WL1 to WL5. Disposed underneath the crossovers between the word lines WL1 to WL5 with the bit lines BL1 to BL10, in a memory-cell area 7, are non-illustrated memory cells including, for example, a transistor and a capacitor.

FIG. 2 shows the course of the bit lines BL2, BL5, and BL9 in the word-line plane: bit line BL5 runs, for example, from the contact 3 in the higher word-line plane at a distance and obliquely over the bit line BL6 in the twist area 1 to then be routed back again to the bit-line plane (FIG. 1) through the contact 4. The same course applies to the bit lines BL2 and BL9, with the contacts 5 and 6, for example, connecting the bit line BL9.

Accordingly, the word line WL2 has an inhomogeneous "neighborhood"; it adjoins the top contact (FIG. 2) of the bit line BL2 and the contacts 3 and 5 of the bit lines BL5 and BL9, respectively, with a metalization-free space being present in the interspace between these contacts. The same applies to the word line WL3, which has contact-free zones between the contacts 2, 4 and 6.

The inhomogeneities in the neighborhood of the word lines WL2 and WL3 have a detrimental effect on the electrical behavior of the semiconductor memory configuration. The inhomogeneous configuration is also disadvantageous for production because the metalizations exhibit discontinuities.

In order to avoid the neighborhood effects caused by such discontinuities or inhomogeneities, the invention now proposes that even the straight bit lines BL3, BL4, BL7, BL8, which do not have any crossovers or twists, be provided with dummy contacts 8 to 11, that is to say with contacts that lead "up" from the bit-line plane (FIG. 1) as far as the word-line plane (FIG. 2) and end at the word-line plane. The configuration ensures that the word lines WL2, WL3 exhibit a continuous and homogeneous neighborhood, so that the aforementioned discontinuities are avoided.

Therefore, the invention permits the maximum electrical and geometrical symmetry with a high density of the bit lines and, simultaneously, a minimum area requirement, in which symmetry the memory-cell area located under the bit lines is completely regular in the twist area 1. The configuration does not produce any additional edge areas, and no special edge elements need be introduced.

It is further noted that, instead of the word lines WL2, WL3, other structures can also be provided. Similarly, the influence by the inhomogeneity of the contacts 2, 9, 4 and 11 and, respectively, 8, 3, 10 and 5, upon other structures is optimized, which leads to the maximum possible symmetry.

The material used for the word lines and the bit lines, as well as for the contacts, can be, for example, aluminum or copper. However, other materials can, of course, also be employed.

In the twist-free area, the bit lines BL1 to BL10 are approximately 150 to 250 nm wide, and preferably about 200 to 225 nm, wide, while in the twist area 1 the bit lines BL1 to BL10 can be 250 nm or 350 nm wide, and, in particular, about 330 nm wide. The contacts themselves have a diameter of approximately 400 nm, while the spacing between the bit lines can be 150 to 200 nm, preferably 150 to 180 nm.

We claim:

1. A semiconductor memory configuration, comprising:
   bit lines in a bit-line plane;
   a further plane different from said bit-line plane;
   word lines; and
   a memory cell area adjacent said bit-line plane,
   some of said bit lines having a twist running alongside others of said bit lines being untwisted, pairs of said some of said bit lines with a twist each respectively defining a twist bit-line pair, said twist bit-line pair having contacts for crossing one bit line of said twist bit-line pair over another bit line of said twist bit-line pair and over said memory-cell area through said further plane,
   said untwisted others of said bit lines having dummy contacts leading from said bit-line plane to said further plane.

2. The semiconductor memory configuration according to claim 1, wherein said further plane is a word-line plane and said word lines are in said word-line plane.

3. The semiconductor memory configuration according to claim 1, wherein said bit-line plane has a twist area including said twist of said some of said bit lines and a twist-free area, and said bit lines in said twist-free area are approximately from 150 nm to 250 nm wide.

4. The semiconductor memory configuration according to claim 3, wherein said twist area only includes said twist of said some of said bit lines.

5. The semiconductor memory configuration according to claim 3, wherein said bit lines in the twist-free area are approximately 200 nm wide.

6. The semiconductor memory configuration according to claim 1, wherein said bit-line plane has a twist area including said twist of said some of said bit lines and said some of said bit lines in said twist area are approximately from 250 nm to 350 nm wide.

7. The semiconductor memory configuration according to claim 6, wherein said some of said bit lines in said twist area are approximately 330 nm wide.

8. The semiconductor memory configuration according to claim 1, wherein said bit lines have a spacing between each other approximately from 150 to 180 nm wide.

9. The semiconductor memory configuration according to claim 1, wherein said bit lines, said word lines, said contacts, and said dummy contacts are selected from the group consisting of copper and aluminum.

* * * * *